(12) United States Patent
Malouin et al.

(10) Patent No.: US 12,288,733 B2
(45) Date of Patent: Apr. 29, 2025

(54) CONFORMAL COOLING ASSEMBLY WITH SUBSTRATE FLUID-PROOFING FOR MULTI-DIE ELECTRONIC ASSEMBLIES

(71) Applicant: JETCOOL TECHNOLOGIES INC., Littleton, MA (US)

(72) Inventors: Bernard Malouin, Westford, MA (US); Jordan Mizerak, Belmont, MA (US); Stuart Putz, Townsend, MA (US)

(73) Assignee: JetCool Technologies Inc., Littleton, MA (US)

( * ) Notice: Subject to any disclaimer, the term of this patent is extended or adjusted under 35 U.S.C. 154(b) by 209 days.

(21) Appl. No.: 17/578,960

(22) Filed: Jan. 19, 2022

(65) Prior Publication Data

US 2022/0230937 A1    Jul. 21, 2022

Related U.S. Application Data

(60) Provisional application No. 63/139,698, filed on Jan. 20, 2021.

(51) Int. Cl.
    *H01L 23/473*    (2006.01)
(52) U.S. Cl.
    CPC .................................. *H01L 23/473* (2013.01)
(58) Field of Classification Search
    CPC .............. H01L 23/473; H05K 7/20218; H05K 7/20254; H05K 7/20272; H05K 7/2039
    See application file for complete search history.

(56) References Cited

U.S. PATENT DOCUMENTS

| 236,519   | A | 1/1881  | Walsh   |
|-----------|---|---------|---------|
| 3,765,728 | A | 10/1973 | Peruglia |

(Continued)

FOREIGN PATENT DOCUMENTS

| CN | 102414813 B | 4/2014 |
|----|-------------|--------|
| CN | 105027021 B | 4/2019 |

(Continued)

OTHER PUBLICATIONS

Celli, "Compressible fluids," retrieved from the Internet: http://galileo.phys.virginia.edu/classes/311/notes/compflu2/node1.html, 1997.

*Primary Examiner* — Jayprakash N Gandhi
*Assistant Examiner* — Matthew Sinclair Muir
(74) *Attorney, Agent, or Firm* — Grady L. White; Potomac Law Group, PLLC

(57) ABSTRACT

A conformal cooling assembly for multiple-die electronic assemblies, such as printed circuit boards, integrated circuits, etc., which addresses and solves a multitude of challenges and problems associated with using liquid-cooled cold plates and dielectric immersion cooling to manage the heat produced by a multiplicity of dies. The conformal cooling assembly comprises a conformal cooling module comprising inlet and outlet passageways and a plenum configured to permit a cooling fluid to pass therethrough, thereby facilitating direct fluid contact with heat-generating components affixed to the substrate of the electronic assembly. The conformal cooling assembly also includes a fastener for attaching the conformal cooling module to the substrate; and a fluid-barrier disposed between the substrate and the plenum. The fluid-barrier is adapted to minimize, inhibit or prevent the cooling fluid from penetrating and being absorbed by the substrate.

27 Claims, 6 Drawing Sheets

(56) References Cited

U.S. PATENT DOCUMENTS

| | | | |
|---|---|---|---|
| 3,841,671 A | 10/1974 | Walker | |
| 3,980,112 A | 9/1976 | Basham | |
| 4,062,572 A | 12/1977 | Davis | |
| 4,090,539 A | 5/1978 | Krupp | |
| 4,696,496 A | 9/1987 | Guelis et al. | |
| 4,796,924 A | 1/1989 | Kosugi et al. | |
| 4,890,865 A | 1/1990 | Hosono et al. | |
| 4,922,971 A | 5/1990 | Grantham | |
| 5,021,924 A * | 6/1991 | Kieda | H01L 23/4336 |
| | | | 361/698 |
| 5,088,005 A | 2/1992 | Ciaccio | |
| 5,183,104 A * | 2/1993 | Novotny | H05K 7/20354 |
| | | | 165/104.34 |
| 5,249,358 A | 10/1993 | Tousignant et al. | |
| 5,263,536 A | 11/1993 | Hulburd et al. | |
| 5,285,351 A | 2/1994 | Ikeda | |
| 5,309,319 A | 5/1994 | Messina | |
| 5,316,075 A | 5/1994 | Quon et al. | |
| 5,349,831 A * | 9/1994 | Daikoku | H01L 23/427 |
| | | | 165/80.4 |
| 5,401,064 A | 3/1995 | Guest | |
| 5,491,363 A | 2/1996 | Yoshikawa | |
| 5,547,231 A | 8/1996 | Sharp | |
| 5,611,373 A | 3/1997 | Ashcraft | |
| 5,687,993 A | 11/1997 | Brim | |
| 5,720,325 A | 2/1998 | Grantham | |
| 5,959,351 A | 9/1999 | Sasaki et al. | |
| 5,999,404 A | 12/1999 | Hileman | |
| 6,225,695 B1 * | 5/2001 | Chia | H01L 29/0657 |
| | | | 257/713 |
| 6,366,462 B1 * | 4/2002 | Chu | H01L 23/427 |
| | | | 257/714 |
| 6,528,878 B1 * | 3/2003 | Daikoku | H01L 23/473 |
| | | | 361/689 |
| 6,546,951 B1 | 4/2003 | Armenia et al. | |
| 6,550,263 B2 | 4/2003 | Patel et al. | |
| 6,550,815 B2 | 4/2003 | Zitkowic, Jr. et al. | |
| 6,604,370 B2 * | 8/2003 | Bash | G06F 1/20 |
| | | | 361/699 |
| 6,729,383 B1 | 5/2004 | Cannell et al. | |
| 6,952,346 B2 | 10/2005 | Tilton et al. | |
| 6,973,801 B1 | 12/2005 | Campbell et al. | |
| 7,104,312 B2 | 9/2006 | Goodson et al. | |
| 7,133,286 B2 * | 11/2006 | Schmidt | H01L 23/473 |
| | | | 361/698 |
| 7,149,087 B2 | 12/2006 | Wilson et al. | |
| 7,233,494 B2 | 6/2007 | Campbell et al. | |
| 7,241,423 B2 | 7/2007 | Golbig et al. | |
| 7,265,976 B1 | 9/2007 | Knight | |
| 7,277,283 B2 * | 10/2007 | Campbell | H01L 23/4735 |
| | | | 165/80.4 |
| 7,511,957 B2 | 3/2009 | Campbell et al. | |
| 7,787,248 B2 * | 8/2010 | Campbell | H01L 23/4735 |
| | | | 174/15.1 |
| 7,802,442 B2 | 9/2010 | Bezama et al. | |
| 7,866,173 B2 | 1/2011 | Brunschwiler et al. | |
| 7,916,483 B2 | 3/2011 | Campbell et al. | |
| 7,978,473 B2 | 7/2011 | Campbell et al. | |
| 7,992,627 B2 | 8/2011 | Bezama et al. | |
| 8,039,975 B2 * | 10/2011 | Donis | H01L 29/0657 |
| | | | 257/712 |
| 8,059,405 B2 * | 11/2011 | Campbell | F28F 3/02 |
| | | | 361/679.53 |
| 8,266,802 B2 | 9/2012 | Campbell et al. | |
| 8,824,146 B2 | 9/2014 | Brok et al. | |
| 8,912,643 B2 | 12/2014 | Bock et al. | |
| 8,929,080 B2 * | 1/2015 | Campbell | H05K 7/20 |
| | | | 257/714 |
| 8,944,151 B2 * | 2/2015 | Flotta | H05K 7/20772 |
| | | | 165/80.4 |
| 8,981,556 B2 | 3/2015 | Joshi | |
| 9,165,857 B2 * | 10/2015 | Song | H01L 23/473 |
| 9,247,672 B2 | 1/2016 | Mehring | |
| 9,445,529 B2 | 9/2016 | Chainer et al. | |
| 9,484,283 B2 | 11/2016 | Joshi et al. | |
| 9,521,787 B2 | 12/2016 | Chainer et al. | |
| 9,530,818 B2 * | 12/2016 | Stern | H01L 27/14683 |
| 9,559,038 B2 | 1/2017 | Schmit et al. | |
| 9,560,790 B2 * | 1/2017 | Joshi | H05K 7/20309 |
| 9,622,379 B1 | 4/2017 | Campbell et al. | |
| 9,638,477 B1 | 5/2017 | Choi et al. | |
| 9,653,378 B2 | 5/2017 | Hou et al. | |
| 9,750,159 B2 | 8/2017 | Campbell et al. | |
| 9,852,963 B2 | 12/2017 | Shedd et al. | |
| 9,901,008 B2 | 2/2018 | Shedd et al. | |
| 9,903,664 B2 | 2/2018 | Joshi | |
| 10,152,096 B1 | 12/2018 | Chen et al. | |
| 10,228,735 B2 | 3/2019 | Kulkarni et al. | |
| 10,270,220 B1 | 4/2019 | Eppich et al. | |
| 10,285,309 B2 | 5/2019 | James et al. | |
| 10,306,802 B1 | 5/2019 | Ditri et al. | |
| 10,426,062 B1 | 9/2019 | Saunders | |
| 10,473,252 B2 | 11/2019 | Oberdorfer et al. | |
| 10,512,152 B2 | 12/2019 | Smith et al. | |
| 10,561,040 B1 | 2/2020 | Lunsman et al. | |
| 10,651,112 B2 | 5/2020 | Malouin, Jr. et al. | |
| 10,665,529 B2 | 5/2020 | Smith et al. | |
| 10,903,141 B2 | 1/2021 | Malouin, Jr. et al. | |
| 10,985,089 B2 | 4/2021 | Hart et al. | |
| 11,018,077 B2 | 5/2021 | Smith et al. | |
| 11,096,313 B2 | 8/2021 | Amos et al. | |
| 11,322,426 B2 | 5/2022 | Malouin, Jr. et al. | |
| 11,439,037 B2 | 9/2022 | Subrahmanyam et al. | |
| 11,594,470 B2 | 2/2023 | Smith et al. | |
| 2002/0075651 A1 | 6/2002 | Newton et al. | |
| 2002/0113142 A1 | 8/2002 | Patel et al. | |
| 2004/0051308 A1 | 3/2004 | Coates | |
| 2004/0194492 A1 | 10/2004 | Tilton et al. | |
| 2005/0210906 A1 | 9/2005 | Laufer et al. | |
| 2005/0280994 A1 | 12/2005 | Yazawa | |
| 2006/0042825 A1 | 3/2006 | Lu et al. | |
| 2006/0250773 A1 | 11/2006 | Campbell et al. | |
| 2006/0250774 A1 | 11/2006 | Campbell et al. | |
| 2007/0017659 A1 | 1/2007 | Brunschwiler et al. | |
| 2007/0091569 A1 | 4/2007 | Campbell et al. | |
| 2007/0121294 A1 | 5/2007 | Campbell et al. | |
| 2007/0121299 A1 | 5/2007 | Campbell et al. | |
| 2007/0221364 A1 | 9/2007 | Lai et al. | |
| 2007/0272392 A1 | 11/2007 | Ghosh et al. | |
| 2007/0274045 A1 | 11/2007 | Campbell et al. | |
| 2007/0295480 A1 | 12/2007 | Campbell et al. | |
| 2008/0037221 A1 | 2/2008 | Campbell et al. | |
| 2008/0278913 A1 | 11/2008 | Campbell et al. | |
| 2009/0013258 A1 | 1/2009 | Hintermeister et al. | |
| 2009/0032937 A1 | 2/2009 | Mann et al. | |
| 2009/0284821 A1 | 11/2009 | Valentin et al. | |
| 2009/0294105 A1 | 12/2009 | Sundararajan et al. | |
| 2009/0294106 A1 | 12/2009 | Flotta et al. | |
| 2009/0316360 A1 | 12/2009 | Campbell et al. | |
| 2010/0052714 A1 | 3/2010 | Miller | |
| 2010/0276026 A1 | 11/2010 | Powell et al. | |
| 2010/0290190 A1 | 11/2010 | Chester et al. | |
| 2010/0328882 A1 | 12/2010 | Campbell et al. | |
| 2010/0328888 A1 | 12/2010 | Campbell et al. | |
| 2011/0277491 A1 | 11/2011 | Wu et al. | |
| 2012/0048515 A1 | 3/2012 | Bhunia et al. | |
| 2012/0063091 A1 | 3/2012 | Dede et al. | |
| 2012/0160459 A1 | 6/2012 | Flotta et al. | |
| 2012/0212907 A1 | 8/2012 | Dede | |
| 2014/0085823 A1 | 3/2014 | Campbell et al. | |
| 2014/0126150 A1 | 5/2014 | Song et al. | |
| 2014/0158326 A1 | 6/2014 | Lyon | |
| 2014/0190668 A1 | 7/2014 | Joshi et al. | |
| 2014/0204532 A1 | 7/2014 | Mehring | |
| 2014/0205632 A1 | 7/2014 | Gruber et al. | |
| 2014/0264759 A1 | 9/2014 | Koontz et al. | |
| 2014/0284787 A1 | 9/2014 | Joshi | |
| 2014/0293542 A1 | 10/2014 | Vetrovec | |
| 2014/0352937 A1 | 12/2014 | Draht | |
| 2015/0043164 A1 | 2/2015 | Joshi | |
| 2015/0096722 A1 | 4/2015 | Zweiback et al. | |
| 2015/0131224 A1 | 5/2015 | Barina et al. | |
| 2015/0208549 A1 | 7/2015 | Shedd et al. | |

(56) References Cited

U.S. PATENT DOCUMENTS

| | | |
|---|---|---|
| 2016/0013115 A1 | 1/2016 | Vadhavkar et al. |
| 2016/0014932 A1 | 1/2016 | Best et al. |
| 2016/0020160 A1 | 1/2016 | Buvid et al. |
| 2016/0120058 A1 | 4/2016 | Shedd et al. |
| 2016/0143184 A1 | 5/2016 | Campbell et al. |
| 2016/0278239 A1 | 9/2016 | Chainer et al. |
| 2017/0092565 A1 | 3/2017 | Chen et al. |
| 2017/0150649 A1 | 5/2017 | Chester et al. |
| 2017/0179001 A1 | 6/2017 | Brunschwiler et al. |
| 2017/0347487 A1 | 11/2017 | Rudnicki et al. |
| 2018/0027695 A1 | 1/2018 | Wakino et al. |
| 2018/0040538 A1 | 2/2018 | Schuderer et al. |
| 2018/0090417 A1 | 3/2018 | Gutala et al. |
| 2018/0124949 A1 | 5/2018 | Marroquin et al. |
| 2019/0013258 A1 | 1/2019 | Malouin, Jr. et al. |
| 2019/0029105 A1 | 1/2019 | Smith et al. |
| 2019/0195399 A1 | 6/2019 | Nguyen et al. |
| 2019/0235449 A1 | 8/2019 | Slessman et al. |
| 2019/0289749 A1 | 9/2019 | Dariavach et al. |
| 2019/0348345 A1 | 11/2019 | Parida et al. |
| 2020/0006197 A1 | 1/2020 | Hart et al. |
| 2020/0011620 A1 | 1/2020 | Sherrer et al. |
| 2020/0015383 A1 | 1/2020 | Gao |
| 2020/0027819 A1 | 1/2020 | Smith et al. |
| 2020/0033075 A1 | 1/2020 | Veto et al. |
| 2020/0100396 A1 | 3/2020 | Iyengar et al. |
| 2020/0168526 A1 | 5/2020 | Malouin, Jr. et al. |
| 2020/0214126 A1* | 7/2020 | Nakashima ............ B32B 27/283 |
| 2020/0253092 A1 | 8/2020 | Chainer et al. |
| 2020/0296862 A1 | 9/2020 | Iyengar et al. |
| 2020/0312746 A1 | 10/2020 | Smith et al. |
| 2020/0328139 A1 | 10/2020 | Chiu et al. |
| 2020/0350231 A1* | 11/2020 | Shen .................... H01L 23/4334 |
| 2021/0134703 A1 | 5/2021 | Malouin, Jr. et al. |
| 2021/0265240 A1 | 8/2021 | Smith et al. |
| 2021/0351108 A1 | 11/2021 | Diglio et al. |
| 2022/0253112 A1 | 8/2022 | Hinton et al. |
| 2023/0269906 A1* | 8/2023 | Wang ................. H05K 7/20272 |
| | | 174/15.1 |

FOREIGN PATENT DOCUMENTS

| | | |
|---|---|---|
| EP | 3188230 A1 | 7/2017 |
| KR | 20110028428 A | 3/2011 |
| KR | 20190077920 A | 7/2019 |
| WO | 2019018597 A1 | 1/2019 |

* cited by examiner

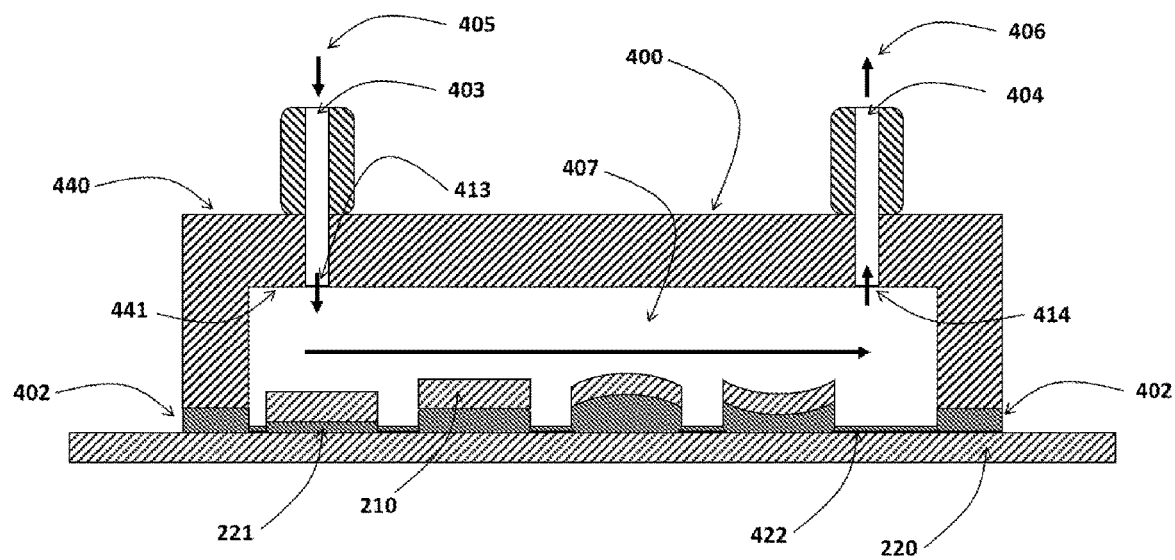
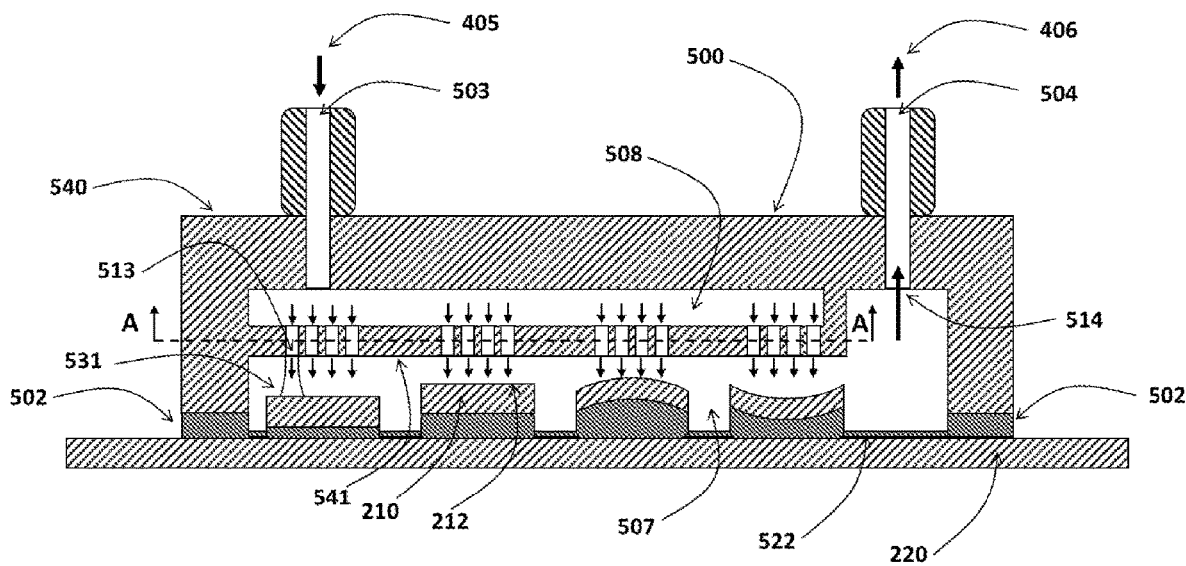

CONFORMAL COOLING ASSEMBLY WITH SUBSTRATE FLUID-PROOFING FOR MULTI-DIE ELECTRONIC ASSEMBLIES

BACKGROUND

The processing units used in wireless communications devices, computer systems and automated industrial manufacturing are becoming smaller, faster and more powerful every year. These advances have driven designers and integrators to rely on electronic assemblies to perform additional and more complex computational tasks and functions. As a result, in some industries, such as high-performance computing, for example, the demand for central processing units (CPUs), graphical processing units (GPUs), and other types of processing units that utilize high-performance, multiple-function and multi-tasking electronic assemblies continues to grow at a very rapid pace.

To meet the increased demand for more powerful, multi-functioning and multi-tasking electronic assemblies in an increasingly digitized world, one technique that is growing in popularity is using multiple dies in a single electronic assembly. Whereas traditionally each electronic assembly in a processing unit comprises a single die to carry out a specific function for the processing unit (e.g. processing cores, memory, I/O, power management, etc.), emerging processing units have been formed with multiple dies on each electronic assembly in the processing unit. Each die in the electronic assembly may be optimized for performing individual functions of the processing unit, such that, when used in combination, all of the dies together provide improved processing performance compared to a traditional single-die electronic assembly.

With this paradigm shift in the structure and performance capabilities of electronic assemblies come new challenges in implementation. Some of these challenges fall into the category of thermal management. Without proper thermal management, multiple dies on a single electronic assembly are vulnerable to overheating, potentially resulting in a decrease in computational performance, reduced lifespan or total failure of the semiconductor dies.

A common technique for managing the heat generated by electronic assemblies involves using liquid-cooled cold plates. Liquid-cooled cold plates typically comprise a plate made of a thermally conductive material (often metal) containing passageways or channels for the cooling fluid to flow through the conductive material. A flat surface of the plate makes thermal contact with the heat-generating component (e.g. the semiconductor die) by way of a thermal interface material (TIM). Heat flows from the component, through the TIM, spreads through the plate via conduction, and is removed by a liquid coolant flowing through the internal passages or channels of the cold plate.

While traditional liquid-cooled cold plates are highly effective in cooling many of today's electronics assemblies, they face challenges in the paradigm shift from single-die to multi-die electronic assemblies, particularly in non-lidded multi-die assemblies. Challenges faced may include, for example, non-uniform die heights, bowing of semiconductor dies, and local hot spots. In these instances, the cold plate may no longer effectively cool the multiple semiconductor dies, as its flat surface may lose uniform contact across the heat-generating surfaces and thereby limit its ability to shed heat, especially from localized hot spots, into the flowing coolant.

As industries shift towards multi-die electronic assemblies, what is needed is a more effective thermal management solution that addresses the key challenges of cooling multi-die electronic assemblies. More specifically, there is considerable need for a cooling device for multi-die electronic assemblies that provides cooling that is conformal to a range of different heights and shapes of the heat-generating components.

SUMMARY

In general, embodiments of the present invention provide a conformal cooling assembly for multi-die electronic assemblies, such as printed circuit boards, integrated circuits, etc., which addresses and solves the above-described challenges and problems associated with using conventional liquid-cooled cold plates to manage the heat produced by a multiplicity of dies. The conformal cooling assembly comprises a conformal cooling module, a fastener and a fluid-barrier. The conformal cooling module comprises inlet and outlet passageways and a plenum. The inlet passageway and outlet passageway are configured to permit a cooling fluid to pass into the plenum to permit direct contact between the cooling fluid and the at least one heat-generating component affixed to a substrate of the electronic assembly. The fastener attaches the conformal cooling module to the substrate. The fluid-barrier is disposed between the substrate and the plenum, and it is configured to minimize, inhibit or prevent the cooling fluid from penetrating and being absorbed by the substrate inside the plenum.

More specifically, embodiments of the present invention provide an apparatus for cooling an electronics assembly, the electronics assembly comprising a substrate and at least one heat-generating element affixed to a surface of the substrate. The apparatus comprises a conformal cooling module which has a first wall and one or more side walls, wherein said one or more side walls are connected to the first wall to define a fluid plenum. The fluid plenum is partially surrounded and enclosed by the first wall and the one or more side walls and is open-ended on a side of the plenum that is opposite from the first wall. The apparatus also comprises a fastener, disposed between the substrate and said one or more side walls of the conformal cooling module, the fastener fixedly attaching said one or more side walls of the conformal cooling module to the surface of the substrate so that the one or more side walls and the open-ended side of the plenum substantially surround and enclose the heat-generating element, as well as a portion of the surface of the substrate to which the heat-generating element is affixed. There could also be multiple heat-generating elements affixed to the substrate and surrounded by the side walls, the first wall and the plenum.

A fluid-barrier is disposed between the one or more side walls and the portion of the surface of the substrate substantially surrounded and enclosed by the plenum. The fluid barrier limits, inhibits or prevents direct contact between a cooling fluid pumped through the plenum and the portion of the surface of the substrate substantially surrounded and enclosed by the side walls and the open-ended side of the plenum.

The conformal cooling module further comprises at least one inlet passageway fluidly connected to the plenum and at least one outlet passageway that is also fluidly connected to the plenum. The inlet passageway and the outlet passageway are both configured to permit the cooling fluid to enter the conformal cooling module via the inlet passageway, pass into and through the plenum to come into direct contact with the at least one heat-generating element, and then exit the conformal cooling module via the outlet passageway. As the cooling fluid passes through the plenum, the direct contact between the cooling fluid and the heat-generating element in the plenum allows the cooling fluid to absorb at least some of the heat generated by the heat-generating element (or elements) to be absorbed by the cooling fluid and carried out of the conformal cooling module via the outlet passageway.

In one use case scenario, a plurality of semiconductor dies are disposed on a printed circuit board (PCB). In accordance with one embodiment of the present invention, the conformal cooling module is fastened to the PCB and configured to facilitate direct, conformal fluid contact between a pressurized coolant with the plurality of semiconductor dies, which enables thermal exchange to minimize thermal resistance and reduce the operating temperature of the PCB. Preferably, but not necessarily, the cooling fluid is re-entrant (i.e., it circulates in and out of the cooling module).

The heat generating components that will be located inside the plenum of the conformal cooling module after it is attached to the PCB are nominally safe for contact with the cooling fluid. However, this is not typically true for electronics outside of the plenum, which could be damaged by exposure to the cooling fluid. Therefore, in addition to attaching the conformal cooling module to the PCB substrate, the fastener also acts a seal between the side walls of the conformal cooling module and the PCB substrate. A primary function of the seal is to protect the circuit electronics outside of the plenum from fluid exposure by preventing, or at least minimizing, the possibility that cooling fluid injected into the plenum can pass underneath the side walls of conformal cooling module and damage the electronics outside of the plenum. Preferably, but not necessarily, the fastener acting as the seal between the conformal cooling module and the PCB substrate is completely fluid-tight (leak-proof). In some embodiments, not necessarily all embodiments, a secondary function of the fastener may be to keep dust or other particles in the ambient environment out of the fluid plenum.

Inside the plenum, the fluid barrier may be disposed on top of the PCB substrate, surrounding the semiconductor dies, to further inhibit fluid penetration into the PCB substrate that lies inside the plenum. This fluid barrier serves to limit fluid absorption of the PCB when exposed to a pressurized fluid coolant over an extended period, minimizing, for example: changes to electrical impedance; compromise of mechanical properties; and potential short-circuits.

Using this conformal cooling assembly, many of the above-described thermal management challenges for emerging multi-die electronic assemblies are addressed. First, as is common in multi-die electronic assemblies, the die surfaces are typically not exactly planar in height due to inherent variability in the die attachment process to the substrate. Unlike conventional thermal management systems, which attach a flat cold plate surface to multiple disparate dies at different heights, the inventive assembly and technique can support variations in the height of various die surfaces without undermining the overall performance of the electronic assembly. Further, each individual die may be subject to deflections across the die surface due to, for example, variations in the solder reflow die attach process. This technique can support deflections of each die individually, as well as accumulated deflections across multiple dies, without impact on the principle of operation. By addressing the issues of non-planar die height and die deflections, the conformal technique avoids process-induced variations in thermal contact; mechanical fatigue/reduced efficacy of thermal interface materials; and stress concentrations of devices (e.g., due to non-uniform attachment pressure on the heat-generating device). Avoiding these issues results in electronic assemblies with more effective thermal management capabilities, longer lifetimes, and higher yields.

In a further embodiment, the conformal cooling module includes a plurality of impingement nozzles to facilitate more effective cooling. When pressurized fluid is passed through the impingement nozzles, the nozzles act to generate small cooling jets to impinge perpendicularly at elevated velocity on the heat-generating surfaces. This provides high convective heat transfer capability, as the thermal gradient between the high temperature heat-generating surface and the low temperature coolant fluid is minimized to allow for efficient removal of heat. These impingement nozzles may be arranged to form arrays over the heat-generating surface, and specifically may be configured non-uniformly to target local areas of high heat generation on the semiconductor dies. This serves to minimize thermal gradients within and across the semiconductor dies, reducing peak temperatures in local hot spot areas.

This configuration therefore provides an effective solution to another challenge of multi-die electronic assembly thermal management: hot spot management. Often, semiconductor dies will contain local areas of heat generation which become thermal bottlenecks that tend to limit or reduce overall device performance. In conjunction with the issues of non-planar die heights and multi-die deflection, local hot spots can become especially severe when there is not uniform attachment between a flat cold plate surface and the semiconductor die surfaces. These local hot spots tend to limit overall device performance, reliability, and lifetime if not addressed.

Thus, conformal cooling assemblies constructed and used in accordance with embodiments of the present invention are designed to provide highly effective thermal management and long lifetime operation of multi-die electronic assemblies by facilitating direct fluid contact with the heat-generating component surfaces and protect the substrate by inhibiting fluid absorption, while avoiding common multi-die assembly pitfalls associated with non-planar die heights, die deflection or bowing, and localized hot spots. Embodiments of the present invention are also very well-suited for use in many of the automated assembly processes common in the semiconductor or circuit board fabrication industries.

BRIEF DESCRIPTION OF THE DRAWINGS

For a better understanding of the present disclosure, reference is made to the accompanying drawings, in which:

FIG. 4 shows an embodiment of the conformal cooling assembly in a cross-sectional view.

FIG. 5 shows another embodiment of the conformal cooling assembly in a cross-sectional view containing direct-die impingement nozzles built into the cooling module with non-uniform nozzle arrangements to provide preferential cooling for localized hot spots of heat generation.

DETAILED DESCRIPTION

This disclosure describes the use of a conformal cooling assembly to provide high effectiveness, high longevity thermal management of multi-die electronic assemblies.

The conformal cooling assembly will be described in various embodiments in the figures to follow. Please note that the figures are not to scale and may have exaggerated features in order to communicate important concepts.

Figure 1:
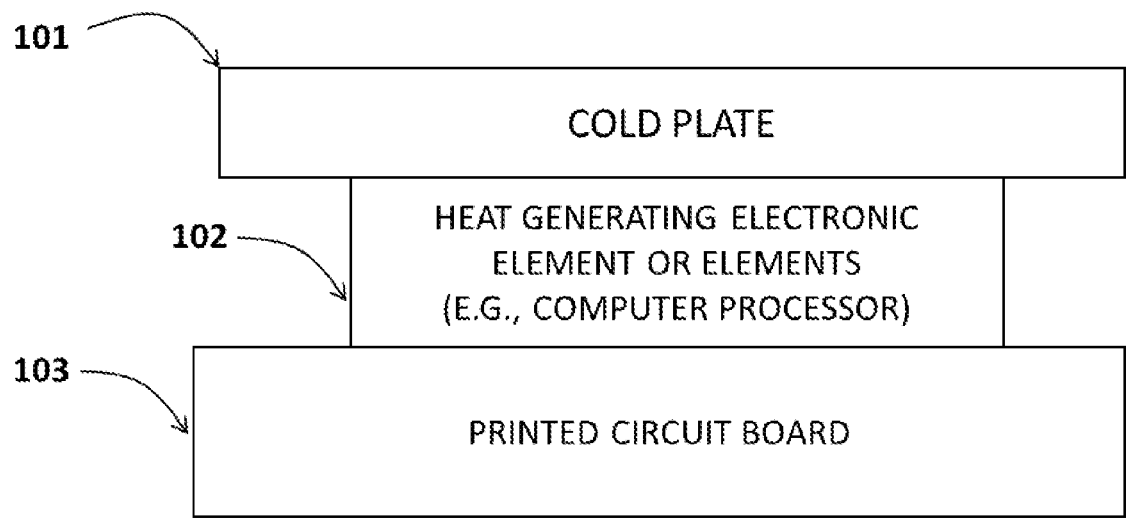
FIG. 1 shows a schematic of a prior art liquid-cooled cold plate.

Many electronic assemblies are comprised of multiple components, including for example, electrical components and printed circuit boards (PCBs). These electronic assemblies often include thermal management hardware, such as fans, heat spreaders, or cold plates. Such an arrangement is shown in FIG. 1, where an electronic assembly (100) comprises one or more heat-generating elements or assemblies (102) disposed on a cold plate (101). The heat-generating elements or assemblies (102) may be, for example, packaged, lidded, or bare die devices. In some instances, for example, a liquid-cooled cold plate (101) may be disposed on a computer processor (102), which may be mounted to another assembly or substrate (103), like a PCB.

Figure 2:
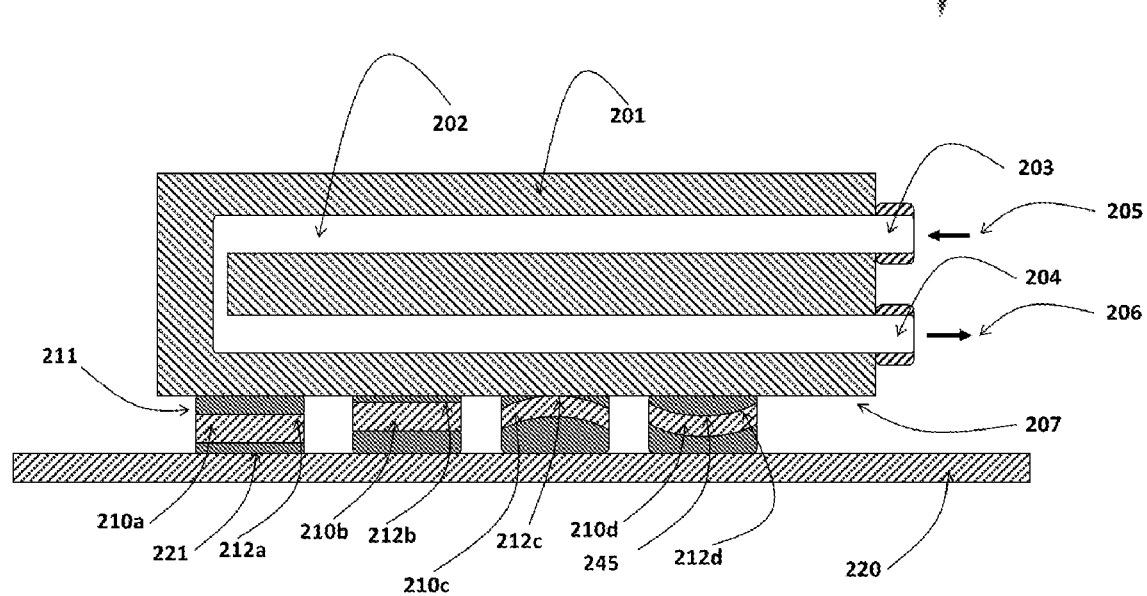
FIG. 2 shows a cross-sectional view of a prior art liquid-cooled cold plate implemented in a multi-die electronics assembly.

FIG. 2 depicts a detailed cross section of an electronic assembly (200) containing multiple dies (210a-210d) cooled by a prior art cold plate (201).

A printed circuit board (220) has, in this non-limiting example, four semiconductor dies (210a-210d) mounted on it. The dies (210a-210d) are affixed to the PCB (220) by way of a die attachment mechanism (221), which is commonly a solder, an underlay adhesive material, or some combination thereof. Die attachment mechanisms utilizing other materials or techniques are possible. Although in FIG. 2 the dies (210a-210d) all appear to be the same size, there may be dies of different sizes and form factors in the same assembly.

FIG. 2 displays two important phenomena that may occur in electronic assemblies containing multiple dies. First, the upper surfaces (212a-d) of the semiconductor dies (210a-d) may not be co-planar in height due to variability in the die construction itself or in the die attachment process. Second, the top surfaces of the individual semiconductor dies (210a-210d) may be non-planar (e.g., bowed, deflected, concave, convex or slanted), due to, for example, non-uniform melting of solder balls.

These two important phenomena are depicted in various examples in FIG. 2. Semiconductor dies (210a) and (210b) do not exhibit any bowing, but their upper surfaces (212a) and (212b) are positioned at different heights above the PCB (220). The differences in the die height may vary, for example, in the range of 50-925 microns (as may be the case for multi-die stacks).

Further, semiconductor dies (210c) and (210d) are positioned at the same centerline height above the PCB (220), but exhibit die deflections. Semiconductor die (210c) exhibits a concave down die deflection, while semiconductor die (210d) exhibits a concave up die deflection. The differences in die deflection may vary by 10's or 100's of microns, for example in the range of 10-500 microns. Note that the die deflections need not be limited to those depicted here; the concavity may not be up or down throughout the entire die, and the center of concavity may not be in the center. In fact, die deflections can occur in any one of an infinite number of different shapes, sizes, and orientations.

These semiconductor dies are often heat-generating components, and heat produced by these dies must be properly managed to avoid overheating. Overheating in semiconductor dies may cause a variety of issues, including but not limited to: thermally induced stresses; reduced lifetimes; compromised device performance; device failures; underlay material failure.

The overheat temperature of a given semiconductor die is influenced by a variety of factors, but especially the semiconductor material itself. Semiconductor dies are typically made out of silicon (Si) or gallium-nitride (GaN). Silicon has been known to overheat at temperatures as low as 100° C. to 125° C. Gallium-nitride has been known to overheat at temperatures as low as 200° C. to 250° C. To avoid overheating the semiconductor dies (as well as other heat related failures), the heat produced by heat-generating elements must be removed before the component reaches overheating temperatures. Typically, this is accomplished by attaching conductive heat sinks or liquid-cooled cold plates to the heat generating components.

Referring again to FIG. 2, a liquid-cooled cold plate (201) containing an internal passage (202), an inlet conduit (203), and an outlet conduit (204) is a typical semiconductor cooling mechanism. The lower surface of the cold plate (207) is mounted to the top surfaces (212a-212d) of semiconductor dies (210a-210d) using a thermal interface material, or TIM, (211) and some sort of fastener (not shown). Heat from the heat-generating semiconductor dies (210a-210d) conducts through the TIM (211) and into the liquid-cooled cold plate (201). The heat spreads throughout the cold plate (201), at which point cool fluid (205) entering through inlet conduit (203) travels through internal passage or channel (202), picking up heat absorbed from the semiconductor dies (210a-210d) the cold plate. The heated fluid (206) is then exhausted through outlet conduit (204) and cooled via a separate heat exchanger (not shown), such as a cooling tower, air or fan heat exchanger with a radiator, chiller loop, or thermosiphon, before being returned to inlet conduit (203) to absorb and carry away more heat.

Of particular importance to the operation of the cold plate is the TIM (211). The TIM promotes heat conduction at the interface of solid surfaces (212) and (207). Without the TIM, microscopic air gaps may form between the two surfaces. Because air is a very poor conductor of heat, the microscopic air gaps can interrupt the smooth flow of heat from the top surfaces (212) of the semiconductor dies (210a-210d) to the lower surface (207) of the cold plate (201).

Although the TIM (~1-10 W/m-K) has a higher thermal conductivity than air (~0.015 W/m-K), it still has a modest thermal conductivity compared to, say, the metal cold plate (201), which is often constructed from a conductive metal such as Aluminum (~200 W/m-K) or Copper (~350 W/m-

K). Therefore, despite filling the microscopic air gaps, there is still a thermal penalty for applying a TIM. This is evidenced by system designers and integrators going through great lengths to minimize the thickness of the TIM and optimizing the TIM thermal properties. TIM thicknesses may be around 100-500 microns, or in special cases may be even lower, such as, for example, 10-50 microns.

Looking again at FIG. 2, the two phenomena of non-planar die heights, and bowing and deflecting die surfaces, introduce a challenge for the application of TIMs in multi-die assemblies. Because the mounting surface of the cold plate (207) is flat, varying TIM thicknesses must be used to attached the cold plate (207) to the upper surfaces of the semiconductor dies (212). In practice, there may be variations of 100's or 1000's of microns in the TIM thicknesses across different semiconductor dies. Because thicknesses of TIMs is 10s to 100s of microns, the thermal performance of each TIM may vary by 100% or greater. Because the temperature gradient across the TIM varies in direct proportion to its thickness, and the thermal performance of the TIMs varies in proportion to the temperature gradient, extreme variations in the thickness of the TIMs can significantly reduce the liquid-cooled cold plate's ability to absorb and remove heat.

Additional problems can arise due to two phenomena associated with the way that multi-die electronic assemblies are manufactured and the way that they operate. First-semiconductor dies have innate non uniform heat generation, which, irrespective of the TIM thickness, creates hot spots on the semiconductor. Second, if TIM thickness is thicker in one spot than another, this will tend to make the spot with the thicker TIM hotter than the locations where the TIM is not as thick, irrespective of the non-uniform heat generation pattern. Both of these phenomena can independently lead to overheating. Of course, when both of these two phenomena are occurring simultaneously, it is the worst case scenario as far as heat-generation and thermal management is concerned.

In FIG. 2, for example, the top surface of semiconductor die (210d) may inherently have a higher local temperature (i.e., a hotspot) at its center (245). Because the hotspot location will always be at a higher temperature than the rest of the surface, the hotspot location will approach and surpass the overheating temperature of the semiconductor material at a lower power level than other surface locations that do not generate as much heat. Moreover, the thicker the TIM in a location on the surface of the semiconductor die, the higher the power density will be at that location, and higher power densities can lead to hot spots forming at that location on the surface of the semiconductor die. In FIG. 2, if semiconductor die (210d) has a concave-up deflection shape at its center (245), then the center (245) of the concavity will be the place where the TIM is thickest. Consequently, the center (245) of the semiconductor die (210d) is more likely to have the highest local temperature, relative to other locations on the top surface, and is therefore more likely to reach or surpass the overheat at lower power levels than other surface locations. the highest power density will be directly adjacent to the center (245).

A final phenomenon of the die height variability involves potential concentrations of stress on the semiconductor dies (210). With the goal of minimizing the TIM thickness and thereby limiting the thermal gradients across the TIM layers, often the cold plate is clamped to the heat-generating devices to ensure intimate TIM contact and complete coverage over the semiconductor surfaces (212). If the apex of the top surface of a bowed semiconductor die, such as semiconductor die (210c) in FIG. 2, is located on a horizontal plane that lies above the height of the top surfaces of all the other dies, a stress concentration from the clamping force may develop on the apex of the top surface (212c) of semiconductor die (210c).

Moreover, if the pressure being exerted on each of the TIMs is not uniform, then over time, certain areas of the TIM may dry out or crack. Especially with thermal cycling of these heated thermal assemblies, TIM deterioration may occur at an accelerated rate, and cause worsening thermal management effectiveness over time and seriously impact the longevity of the electronic assembly.

In sum, for multi-die electronic assemblies like the one shown in FIG. 2, the variability in the device die geometry, fabrication, and attachment process to the printed circuit board introduces a variety of challenges when attempting to use a liquid-cooled cold plate to reduce the heat. An alternative cooling assembly addressing these challenges would be useful for high effectiveness and high longevity operation of multi-die electronic assemblies.

Figure 3:
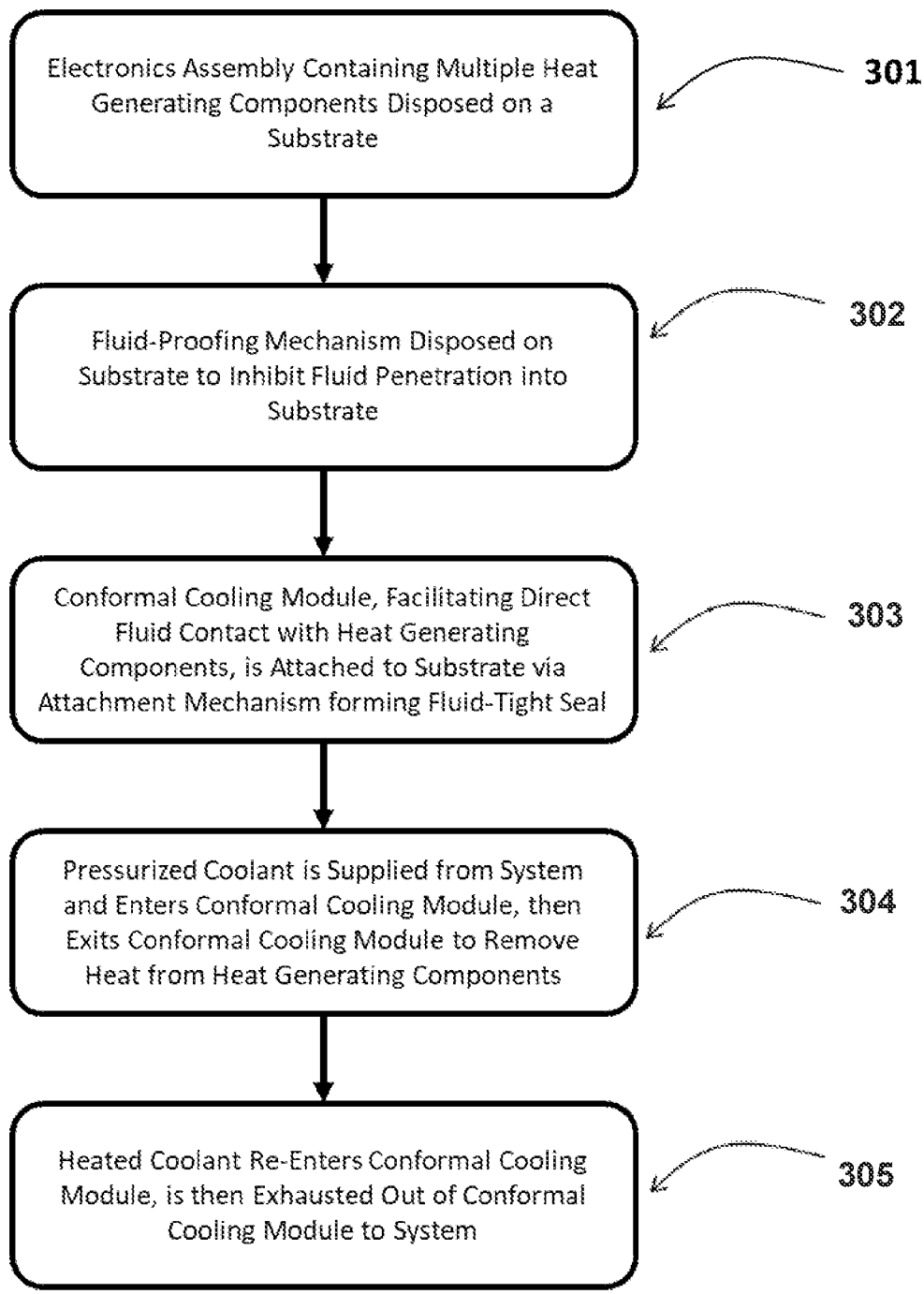
FIG. 3 shows a flow chart describing an embodiment of the conformal cooling assembly.

FIG. 3 shows a linear flowchart illustrating, by way of example, the primary steps performed by a conformal cooling assembly constructed and used according to one embodiment of the present invention. As shown in FIG. 3, the first step (step 301) comprises disposing an electronics assembly containing multiple heat-generating components on a substrate. In step 302, a fluid-proofing mechanism, or barrier, is disposed on the substrate to inhibit penetration of the fluid into the substrate. Examples of fluid-proofing mechanisms and barriers include without limitation a coating, a metal film, a non-permeable polymer film, a reactive dry film adhesive, a pressure sensitive adhesive, a liner, a seal, or any combination of two or more thereof. Next, in step 303, a conforming cooling module, like the conformal cooling module 400 shown in FIG. 4, is attached to the substrate using an attachment mechanism. Non-limiting examples of attachment mechanisms include screws, an elastomeric gasket, an adhesive material, a chemical bond, a weld, a braze, a spring clamp, solder, or any combination of two or more thereof. At step 304, a pressurized coolant (typically supplied by an external source in the electronic system) enters the conformal cooling module, passes into a chamber (or plenum) in the conformal cooling module to flow over the heat-generating elements, and thereby absorbing and removing heat from the heat-generating elements as it is exhausted out of the other end of the conformal cooling module (step 305).

Although the flowchart in FIG. 3 shows a particular order and a particular number of steps, it should be noted that the order and the number of steps performed by different embodiments of the present invention may be different from the order and number of steps shown in the example illustrated in FIG. 3, depending on the situation and the requirements of the particular application. For example, the heat-generating elements may be disposed on the substrate using an underlay material first, at which point a mask is applied to deposit the fluid-barrier so that the fluid barrier will be bounded by the heat-generating elements. This step may then be followed by the step of attaching the conformal cooling module to the substrate using a fastener. In another implementation, the fluid-barrier may be deposited first, followed by the attachment of the heat-generating elements by way of an underlay material, followed by the fastener. The entire substrate may be fluid-proofed, or only certain portions may be fluid-proofed. When the conformal cooling module is present, the fastener may be applied simultaneously with the application of the coating that provides the fluid-proofing barrier, especially if, for example, the same adhesive material is used for the fluid-proofing barrier and the fastener. Other sequences of steps and techniques are of course possible, giving the conformal cooling assembly potential supply chain flexibility to be integrated at different steps of the process.

FIG. 4 shows, by way of example, a conformal cooling assembly constructed in accordance with one embodiment of the present invention. As shown in FIG. 4, a substrate (220), such as a printed circuit board (sometimes abbreviated by "PCB"), has at least one heat-generating element (210), such as a semiconductor die, disposed on it. In one non-limiting example, there are four heat-generating elements. The heat-generating elements (210) are disposed on the substrate (220) by way of an underlay material (221), whether a solder, adhesive, or other material, or some combination thereof. The tops of the semiconductor dies (210) may, or may not, be of varying heights and shapes. A conformal cooling module (400) is attached via a fastener (402) to enclose a portion of the substrate (220) and the semiconductor dies (210), forming a seal. There is a fluid-barrier (422) disposed on the substrate to inhibit exposure of the substrate lying inside the inner walls of the conformal cooling module to fluid.

In operation, a pressurized, cooling fluid (405) enters the conformal cooling module (400) through at least one first inlet conduit (403), crossing the outer boundary (440) of the conformal cooling module (400). The fluid then exits the conformal cooling module (400) through at least one first outlet conduit (413), crossing the inner boundary (441) of the conformal cooling module (400). The fluid then comes in direct contact with the heat-generating elements (210) in fluid plenum (407) that is located between the inner boundary (441) of the conformal cooling module (400) and the substrate (220) and the heat-generating elements (210) carried on the substrate (220). The fluid absorbs heat from the heat-generating elements (210) as it passes through the fluid plenum. The now-heated fluid then re-enters the conformal cooling module (400) through at least one second inlet conduit (414), crossing the inner boundary (441) of the conformal cooling module (400). Finally, the fluid is exhausted through at least one second outlet conduit (404), crossing the outer boundary (440) of the conformal cooling module (400). In some embodiments, the heated fluid (406) may be cooled via a separate heat exchanger, such as a cooling tower, chiller loop, or thermosiphon, before being returned to the at least one first inlet conduit (403).

Note that in the operation of this embodiment of a conformal cooling assembly, thermal interface materials may not be required. Because the fluid exits the cooling module and conformally comes in direct contact with the heat-generating elements, there are no solid-solid interfaces in which gap filling is required. Because of this fact, the thermal challenges of TIMs on multi-die electronic assemblies, including variable gross TIM thicknesses, local hot spot TIM thicknesses, and TIM thermal cycling, are mitigated. Furthermore, with the fastener (402) serving to attach the cooling module (400) to the substrate (220), the mechanical challenges of the assembly including stress concentrations, non-uniform TIM pressure, and potential TIM deterioration are also mitigated. These attributes act to produce a highly effective, long-lasting thermal management system for multi-die electronic assemblies.

Cooling fluids may include, for example, water, water-glycol mixes, dielectric fluids, mineral oils, ammonia, and other. It should be understood that the term "fluid-proofing" in this context does not necessarily mean that the fluid barrier is completely impervious to the cooling fluid, or that it prevents 100 percent of the cooling fluid from coming into contact with the substrate. Instead, it should be understood that, even with the barrier in place, some amount of the cooling fluid may still pass all the way through the barrier to reach and/or be absorbed by the substrate. It is sufficient for the barrier to be capable of preventing at least some of the cooling fluid from contacting the substrate, thereby serving to limit or reduce the substrate's exposure to the cooling fluid to an acceptable level, depending on the application. However, it is also understood that, in some embodiments of the present invention, the fluid barrier may in fact provide a complete barrier to the fluid, such that none of the cooling fluid may pass through the barrier and reach the substrate.

Substrates may be made from a variety of materials, such as metals (e.g. Copper-Molybdenum, Copper, Nickel-Plated Copper, etc.), epoxy-based plastics (e.g. FR-4/5, G-10/11), or other polymer or composite materials. In the cases where metal substrates are used, the substrates typically display good fluid resistance characteristics, and a minimal level of fluid-proofing may be implemented.

However, in the case of many plastics and epoxies, as is common in PCBs, there is a tendency for light levels of fluid absorption over time when subject to pressurized and heated fluids. If fluid-proofing is not implemented in these substrates, fluid absorption may cause phenomena such as circuit board impedance changes, mechanical alterations, or in extreme cases, short circuits. Other phenomena are also possible. A more substantial fluid-barrier would be required with, for example, epoxy-based substrates as compared to, for example, metal-based substrates.

Referring again to FIG. 4, a fluid-barrier (422) may be deposited on the substrate (220), bounded by the fastener (402) and the heat-generating element underlay material (221) or heat-generating element (210). Depending on the level of fluid-proofing called for by the application, the fluid-barrier (422) may comprise a liquid-based sealant such as a silicone; it may also include a liquid-based adhesive such as an epoxy or glue. The fluid-barrier (422) may also comprise a combination of these or other liquid-based sealants and adhesives. For example, the fluid-barrier (422) may comprise the same adhesive material that is used in the underlay material (221). The fluid-barrier (422) may comprise a high temperature adhesive near the heat-generating elements (210), while using a low temperature adhesive near the fastener (402). The adhesives may be heat-activated, UV activated, pressure activated, or another activation method, or some combination thereof. The fluid-proofing barrier (422) may also comprise conformal coating made of one or some combination of the above-mentioned materials. Other fluid-barriers are of course possible.

In certain configurations, a hydrophobic surfactant may be applied in combination with an adhesive or sealant material. This may allow for water repelling of fluid from surfaces of interest. The surfactant may be in direct contact with the substrate to shed any trace liquids penetrating through the fluid-barrier, or may be applied to the fluid-barrier subject to the pressurized fluid. Other configurations may be possible. Note, the hydrophobic surfactant or fluid-proofing material would ordinarily not be applied to the actual die heat transfer surface.

The fastener (402) between the conformal cooling module (400) and the substrate (220), which may serve as both an attachment mechanism and a seal to help protect components outside of the conformal cooling module, may also take on a variety of forms. For example, the fastener may be an elastomeric gasket compressed by way of a fastener (not shown). The fastener may be a liquid adhesive or epoxy, either the same as or different from the fluid-barrier. The fastener may also be a solder material. This, like the fluid-barrier, may depend on a variety of application specific factors, such as: fluid pressure and temperature; substrate material; cooling module material; fluid type; arrangement of heat-generating samples on the substrate; size and shape of substrate. Other factors may also be important. Also, as discussed in more detail below, the fastener may, rather, be located between the conformal cooling module and the fluid-barrier and is not necessarily in direct contact with the substrate.

The conformal cooling module (400) may also take on a variety of forms. While typical thermal management hardware for heat-generating devices is made of highly thermally conductive metals, the conformal cooling assembly constructed in accordance with embodiments of the present invention may be made from a variety of different materials. Because the cooling assembly does not rely on spreading or conducting of heat throughout a plate to be removed by an internal passage, it may be made from a material of lower thermal conductivity for potential savings in cost, increased longevity due to mitigated corrosion concerns, and environmental benefits. The module may be made from high conductivity metals (copper, aluminum), low conductivity metals (steel, copper-molybdenum, invar), polymers, composites, or others. As the conformal cooling module facilitates direct contact of the fluid with the heat-generating elements, its thermal properties are not of primary concern.

The first inlet conduit (403) and the second outlet conduit (404) may take on a variety of forms. In certain cases, they may be fluid fittings, such as barbed fittings, compression fittings, welded tube studs, push-to-connect fittings, threaded fittings, or other materials. In other cases, the conduit may attach to a fluid manifold or flow distribution plate.

In certain other embodiments, the heat-generating elements (210) may have disposed on them, within the outer perimeter of the conformal cooling module, heat-transfer-enhancing features like fins, channels, or pins. Such heat enhancing features may allow for increased surface area, local fluid flow effects such as turbulence, or some combination thereof. Increased surface area and turbulence allow for increased heat transfer by way of more intimate contact of the fluid with the heat-generating elements (210).

In summary of FIG. 3 and FIG. 4, a conformal cooling assembly is presented in one embodiment. In a substrate where multiple heat-generating components are disposed, a conformal cooling module is attached to the substrate via a fastener to facilitate direct fluid contact of the coolant fluid with the heat-generating elements contained within its outer perimeter. A fluid-barrier is disposed on the substrate to inhibit fluid penetration into the substrate.

FIGS. 5-11 show other embodiments of the conformal cooling assembly. Other embodiments are of course possible, but FIGS. 5-11 are meant to show a representative sample of potential implementations for a variety of potential scenarios.

FIG. 5 displays an embodiment with a variation in the conformal cooling module (500). A cool fluid (405) enters the cooling module (500) through at least one first inlet conduit (503), crossing the outer boundary (540) of the cooling module (500), and enters into an intermediate reservoir (508). The fluid at this stage has not exited the conformal cooling module (500). It is then passed through a first set of outlet conduits (513), now in a plurality, crossing the inner boundary (541) of the cooling module (500). The fluid, having exited the conformal cooling module (500) and entered the fluid plenum (507), takes heat away from heat-generating components (210) by way of direct fluid contact with the heat-generating devices (210). The fluid then may re-enter the conformal cooling module (500) through at least one second inlet conduit (514), crossing the interior boundary (541) of the cooling module (500). The fluid then exits the conformal cooling module (500) through at least one second outlet conduit (504), where heated fluid (406) is then cooled via a separate heat exchanger, such as a cooling tower, chiller loop, fan and radiator, or thermosiphon, before being returned to inlet conduit (503). The same coolant need not be returned to the conformal cooling module, of course. The conformal cooling module is attached to substrate (220) using fastener (502), and a fluid-barrier (522) is disposed on the substrate (220). The conformal cooling module may also be attached, via a fastener (502), to the fluid-barrier (522) as opposed to the substrate.

In certain embodiments of FIG. 5, the first set of outlet conduits (513) may be impingement nozzles, creating microjets (531) to impinge upon the upper surface (212) of heat-generating elements (210). Microjet cooling is a highly effective convective heat transfer mechanism, facilitating very high heat transfer per unit area by way of boundary layer suppression using high velocity jets directed perpendicularly at the heat transfer surface (212). This approach provides the conformal cooling on multi-die assemblies with a single conformal cooling module. Heat transfer is often quantified by the heat transfer coefficient, for which microjet cooling may generate heat transfer coefficients in the range of 50,000-400,000 $W/m^2$-° C. for single-phase operation (cf cold plates ~1,000-5,000 $W/m^2$-° C., microchannel cold plates ~10,000-30,000 $W/m^2$-° C.). By utilizing single-phase microjet cooling in the conformal cooling module (500), extremely effective thermal management of the heat-generating components (210) may be accomplished.

Figure 6:
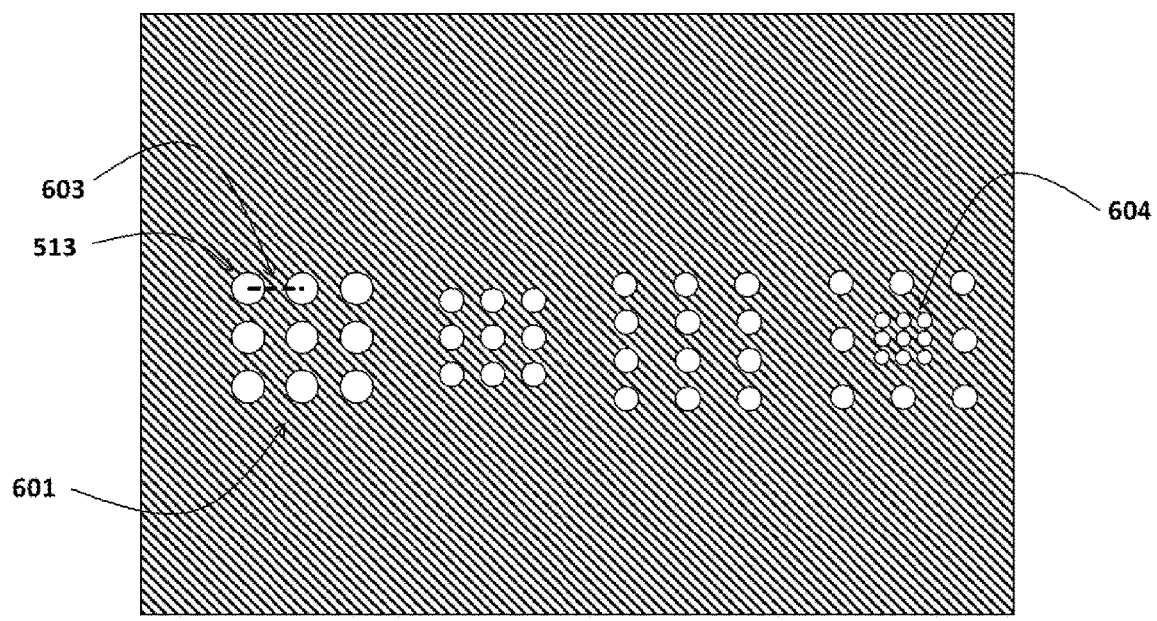
FIG. 6 shows an embodiment of the conformal cooling assembly with direct-die impingement nozzles of different configurations to minimize thermal gradients between varying heat loads in a cross-sectional view.

FIG. 6, a cross section taken along Section A-A of a similar conformal cooling module to that of FIG. 5 with impingement nozzles, displays possible embodiments of the first set of outlet conduits (513). Because the heat-generating elements (210) are in highest need of thermal management, such an arrangement showed in FIG. 6 preferentially delivers fluid to the heat-generating elements, as opposed areas of the substrate where little or no heat generation occurs. The impingement nozzles (513) may be arranged in an array (601) at a spacing (603) to remove heat. Each heat-generating element may be of different size, different heat load, or different heat load allocation across the surface. Therefore, impingement nozzle arrays (601) may be individually tailored to each heat-generating element to provide the most effective thermal management in the areas it is needed most. Further, within a single heat-generating element, there may be a hot spot zone of higher heat generation, where a preferential fluid delivery can be implemented to provide more effective thermal management. For example, in FIG. 2 it was described that a hot spot zone of high heat generation (245) was shown in the middle of the right-most heat-generating element (210d). In FIG. 6, a dense array of nozzles (604) may target the hot spot zone of high heat generation to minimize thermal gradients within a heat-generating element, on top of minimizing thermal gradients across heat-generating elements.

As shown in FIG. 6, the possibilities of impingement nozzle arrays are quite varied, including those containing different nozzle sizes, different nozzle spacings, different numbers of nozzles, different array sizes, and different array layouts. Other geometric configurations are possible, too.

Figure 7:
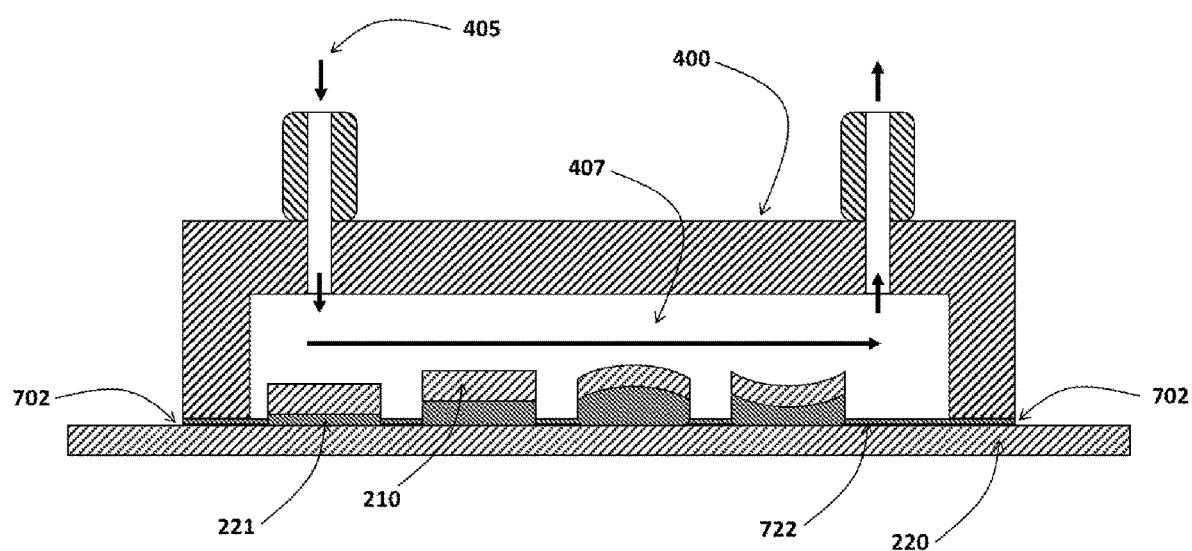
FIG. 7 shows another embodiment of the conformal cooling assembly in a cross-sectional view in which the barrier used for fluid-proofing the substrate and fastening the conformal cooling module to the substrate are the same.

FIG. 7 shows another embodiment of a conformal cooling assembly wherein the fastener (702) and the fluid-barrier (722) are completed as a single step. In this embodiment, the fluid-barrier (722) and fastener (702) may be accomplished using a liquid adhesive material, such as an epoxy with low water absorption rates. This may provide a streamlined assembly process of the conformal cooling assembly by using the same material to accomplish two mechanisms.

Figure 8:
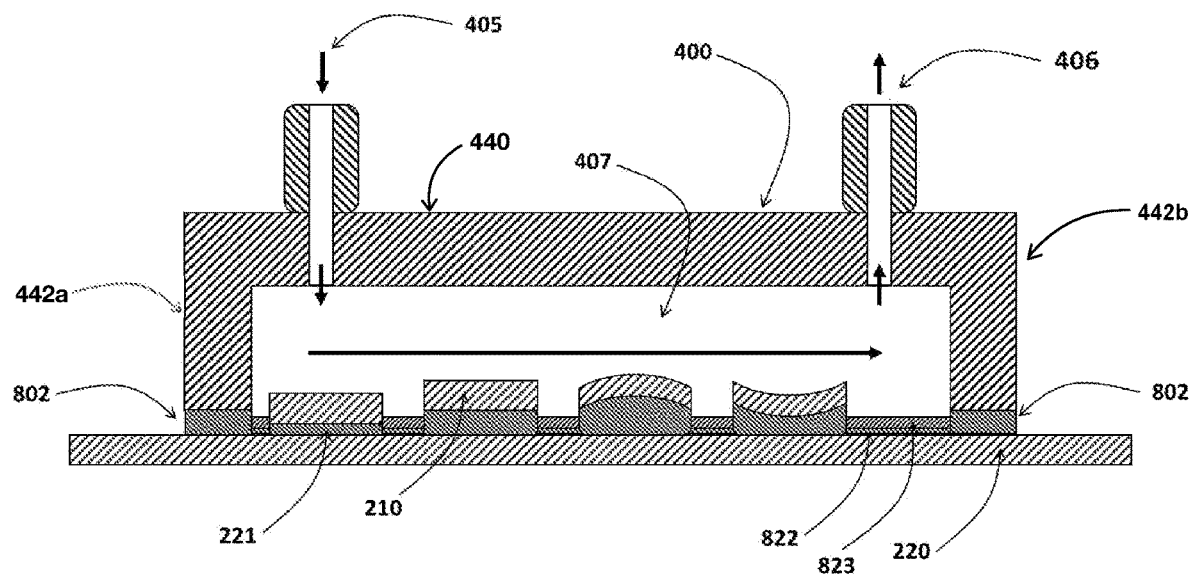
FIG. 8 shows another embodiment of the of a conformal cooling assembly wherein the fluid-barrier is done in a two-step process.

FIG. 8 shows another embodiment of the of a conformal cooling assembly wherein the fluid-barrier is done in a two-step process. A fluid barrier (823), such as a metal film, a non-permeable polymer film, or other highly fluid-resistant material may be disposed on the substrate (220) using an adhesive (822) or deposition process. The adhesive (822) may be a liquid adhesive as discussed in FIG. 7, or it may be a reactive dry film adhesive, or a pressure sensitive adhesive. The case of a fluid barrier (823) with a reactive dry film adhesive or pressure sensitive adhesive (822) may lend itself well to a die cutting process, and could simplify the process without requiring any heat, UV, or other activation techniques as is done with many liquid adhesives. If needed, a secondary liquid adhesive may be used to fill any gaps created between the die cut fluid barrier (823) and the die underlay (821), heat-generating elements (210), and fastener (802). Alternatively, the fluid barrier (823) may extend such that the fastener (802) attaches the conformal cooling module (400) to the fluid barrier (823), which is attached to the substrate (220). Note again that the figures are not to scale; the fluid barrier (823) may be as thin as 0.001-0.005" in certain implementations, while typical heat-generating semiconductor die thicknesses may be on the order of 0.010-0.030".

Figure 9:
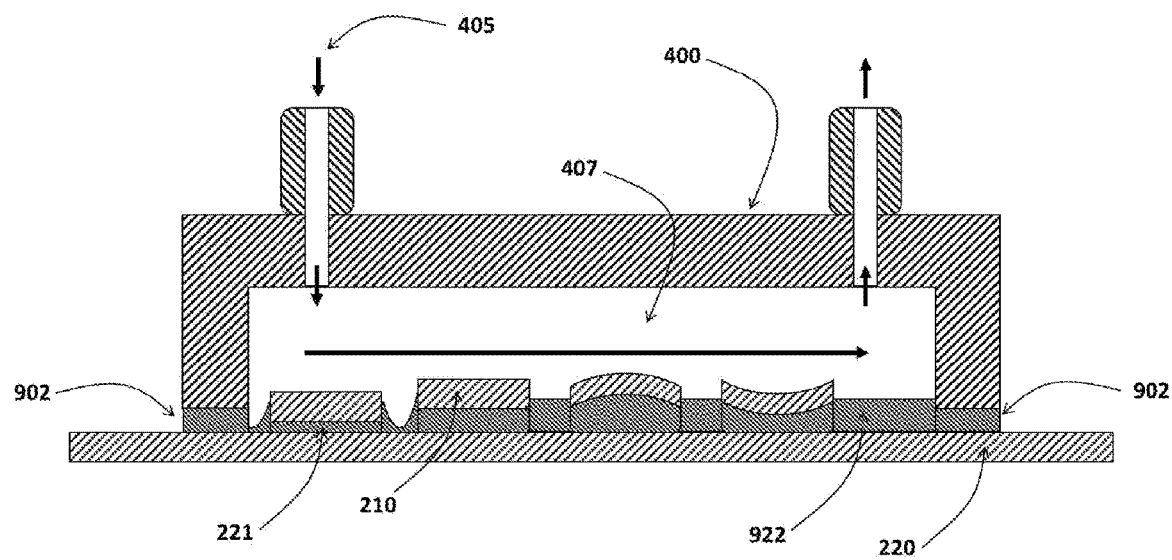
FIG. 9 shows another embodiment of the conformal cooling assembly in a cross-sectional view in which a fluid barrier is disposed on the vertical walls of the heat-generating components to provide some fluid-proofing protection of the substrate.

In every embodiment shown thus far, the fluid-barrier has been bounded by the heat-generating element underlay material (221). In certain embodiments, however, it may be preferable to bind the fluid-barrier to the walls of the heat-generating elements (210). FIG. 9 shows such an embodiment, where fluid-barrier (922) is bounded by heat-generating elements (210), extending above underlay material (221). This may be done in one implementation, for example, where a pre-specified volume of sealant is deposited onto the substrate inside of a containment perimeter, and the sealant is melted and flowed to create a uniform layer surrounding the heat-generating elements (210) up to a specified height. In certain cases, the fluid-barrier (922) may extend up and contact the walls of the heat-generating surface (210) above the height of the general fluid-proofing layer. In others, for example, the fluid-barrier may spill over onto the upward facing surface of the heat-generating element (210). Notably, the die underlay (221) and fluid-barrier (922) may be applied simultaneously to simplify the manufacturing process.

Figure 10:
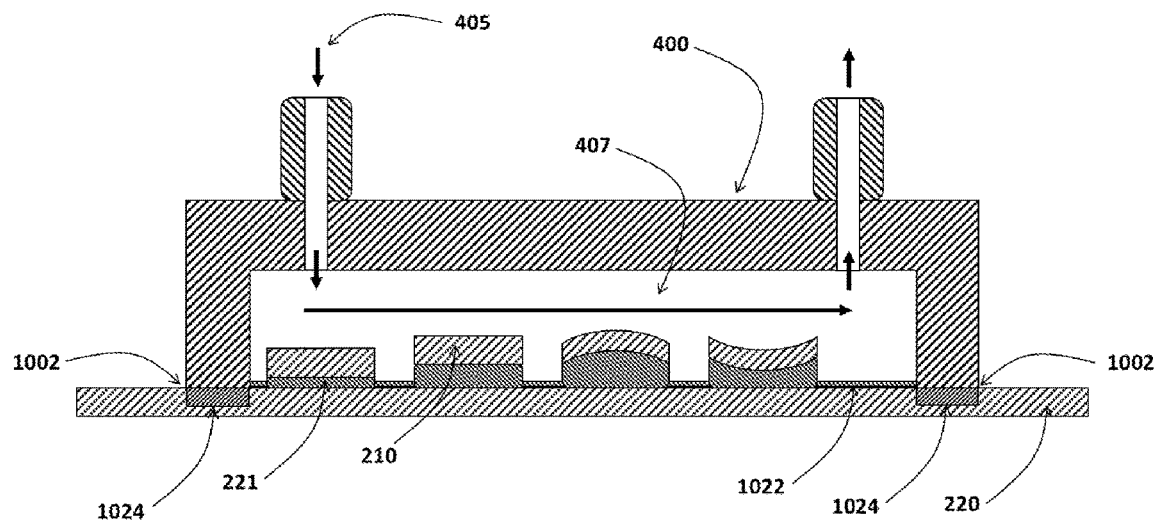
FIG. 10 shows another embodiment of the conformal cooling assembly in a cross-sectional view in which the fastener is a solder using a built-in solder trace on the substrate.
Figure 11:
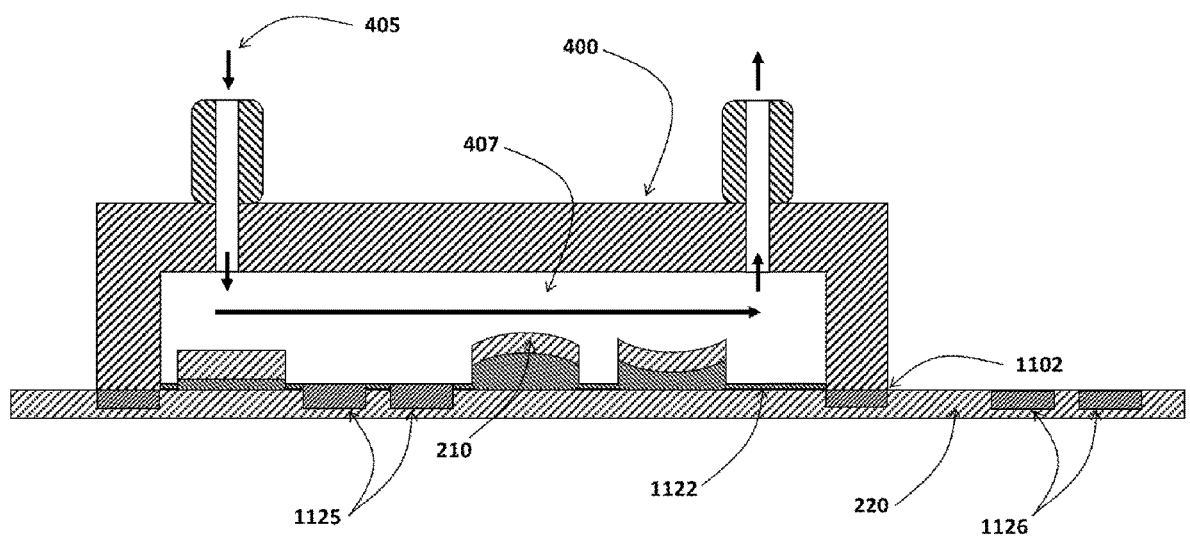
FIG. 11 shows another embodiment of the conformal cooling assembly in a cross-sectional view in which solder traces are included to serve as fluid detection circuitry.

FIG. 10 shows another embodiment of a conformal cooling assembly where there is an alternative fastener (1002). In this embodiment, the substrate (220) contains pre-manufactured copper and/or solder traces (1024) where attachment to the conformal cooling module (400) occurs. In this case, the assembly may be passed through a solder re-flow process, where the solder from solder traces (1024) melts. The melted solder forms a bond (1002) between the substrate (220) and the cooling module (400). This may allow for a strong attachment joint (1002) that is built-into the substrate (220) in the design process, allowing for a fastening procedure compatible with current substrate manufacturing processes, for example, automated liquid dispensing equipment or automated pick-and-place machines and solder reflow assembly equipment.

Other trace functions may also be built into the multi-die cooling assembly. For example, in FIG. 11, two substrate traces (1125) can be placed in close proximity to one another on the outer surface of the substrate, with an electrically insulating material (e.g., the substrate material (220)) between them. When these traces are placed within the perimeter of the conformal cooling module (400) and extend through the fluid-barrier (1122), they can be implemented as a fluid detection device. That is, when conductive fluid (e.g., water) fills the plenum (407) bounded by the conformal cooling module (400) and the substrate (220) (or fluid-barrier (1122), the proximate traces which are ordinarily an open connection may form a closed electrical circuit. This can be used as a telemetry or diagnostic tool to determine whether fluid is within the assembly or not without the need for visual inspection.

Further, similar proximate traces (1126) may also be placed outside the perimeter of the conformal cooling module (400). Their principle of operation would be similar, but their functionality would be the opposite. For example, by fluid bridging the insulating gap between them and closing the circuit, the traces (1126) may be used to produce an electrical signal that fluid has egressed outside of the conformal cooling module (400), indicating a leak or failure of the fastener (1102), the fluid-barrier (1122), or some other aspect of the assembly. These help to form an integrated, compact assembly that provides conformal cooling to multiple heat-generating elements (210) while having the ability to build-in failure reporting.

Conformal cooling assemblies constructed in accordance with embodiments of the present invention may be used with many types and varieties of heat-generating electronic assemblies. The heat-generating electronic assemblies are constructed so that at least one heat-generating element is disposed on a substrate. Typically, however, the heat-generating electronic assemblies are constructed to have a multiplicity of heat-generating elements affixed to the surface of the substrate, as illustrated in FIGS. 4-7 and 9-11. As shown in these figures, and described in detail above, the conformal cooling assemblies of the present invention include a conformal cooling module that is attached to the substrate via a fastener, and the substrate surface is fluid-proofed via a fluid-barrier disposed between the surface of the substrate and a plenum. The conformal cooling module receives cooling fluid from a pressurized source through at least one first inlet conduit, exits the cooling module through at least one first outlet conduit to pass into the plenum to make direct fluid contact with the at least one heat-generating element. The cooling fluid re-enters the cooling module through at least one second inlet conduit, and is then exhausted through at least one second outlet conduit.

In terms of its physical geometry and structure, it should be evident from FIGS. 4-11, that in certain embodiments, the conformal cooling module comprises a top wall, one or more side walls, a fluid plenum, at least one inlet passageway and at least one outlet passageway. Perhaps best illustrated in FIG. 8, for example, it will be observed that the conformal cooling module (400) comprises a top wall (440), two side walls (442a and 442b), a fluid plenum (407), an inlet passageway (405) and an outlet passageway (406). Because the illustration in FIG. 8 shows only a cross-sectional diagram of the conformal cooling assembly of the present invention, it is understood that conformal cooling module (400) two additional side walls, which, for the sake of easy comprehension, are not shown in FIG. 8. It will be understood, however, that the conformal cooling module (400) could have only one side wall, or any number of side walls, depending on whether the overall shape of the conformal cooling assembly. For instance, the overall shape of the conformal cooling assembly could be cylindrical (requiring only one circumferential side wall), triangular (three side walls), trapezoidal (four side walls), hexagonal (eight side walls), to name but a few examples of potential overall shapes and corresponding numbers of side walls.

The top portions of the side walls (442a and 442b) are joined to the perimeter edges of the top wall (440) to define boundaries around the fluid plenum (407). Thus, the fluid plenum (407) is partially surrounded and enclosed by the top wall (440) and the side walls (442a and 442b). However, the bottom side of the fluid plenum (407) of the conformal cooling module (400), i.e., the side of the fluid plenum (407) that is opposite from the top wall (440), is open-ended because the conformal cooling module (400) itself does not have a wall on the bottom side of the fluid plenum (407) opposite from the top wall (440). Consequently, the bottom of the conformal cooling module (400) remains open until the side bottom portions of the side walls (442a and 442b) of the conformal cooling module are fastened to the substrate (220) with the fastener (802) in order to complete construction of the conformal cooling assembly. When the conformal cooling module (400) is fastened to the substrate (220) with the fastener (802), all of the side walls, including the side walls (442a and 442b), and the open-ended side of the fluid plenum (407) substantially surround and enclose the heat-generating elements 210 and a portion of the surface of the substrate to which the heat-generating elements (210) are affixed. The fluid plenum (407) is considered to be "substantially surrounded and enclosed," and not completely surrounded and enclosed, due to the existence of the inlet passageway (405) and the outlet passageway (406) extending through the top wall (440) of the conformal cooling module (400).

Although this description refers to the wall opposite the open side of the plenum as the "top" wall, it will be recognized and understood that the top wall is not always necessarily "above" the substrate and heat-generating elements. Thus, the "top wall" referenced in this description could actually be below or to the right or left of the substrate and heat-generating elements, depending on the final placement and orientation of the electronics assembly and conformal cooling assembly in the assembled processing unit. It is also understood that, depending on the requirements of the particular processing unit, the inlet and outlet passageways may, in some embodiments, be located and extend through the side walls of the conformal cooling module instead of the top wall without departing from the scope of the present invention.

As previously described and illustrated in FIGS. 5 and 6, the conformal cooling module (400) may be configured to provide preferential fluid delivery to certain heat-generating elements (210) or certain parts of heat-generating elements (210) to minimize localized hot spots. It may also comprise impingement nozzles to facilitate exceptionally high thermal transfer of the fluid with the heat-generating elements. Conformal cooling assemblies of the present invention provide a highly effective option for thermal management of substrates containing multiple disparate heat-generating elements, especially multi-die assemblies which have non-planar die heights, die deflections or bowing, and local hot spots of high heat generation. These features and advantages also tend to improve the longevity of the electronic assemblies upon which they are used.

The conformal cooling assembly may provide an alternative to existing thermal management techniques, such as liquid-cooled cold plates and dielectric immersion cooling. Liquid-cooled cold plates may have thermal and mechanical challenges in multi-die assemblies from variable thermal interface material layer thicknesses, stress concentrations, increased risk of TIM deterioration due to non-uniform TIM pressure, and hot spot unpredictability. Meanwhile, dielectric immersion cooling, a cooling method that may cost more, is less effective for managing heat, and can be environmentally unfriendly depending on the immersion coolants used, tends to produce multi-die assemblies that do not last as long and do not operate as well in applications requiring high-power density. While fluid-proofing solutions similar to the fluid-proofing solution disclosed and claimed herein may be of interest to immersion cooling techniques, immersion cooling may require that the entire PCB would have to be fluid-proofed, which would be process-intensive and costly, and may still struggle to achieve adequate performance with certain hardware elements, such as optical connectors. Embodiments of the present invention, which provide localized fluid proofing is a more effective, longer lasting and environmentally friendly solution for applications requiring power-dense processing units.

The present disclosure is not to be limited in scope by the specific embodiments described herein. Indeed, other various embodiments of and modifications to the present disclosure, in addition to those described herein, will be apparent to those or ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An electronics assembly, comprising:
a substrate;
at least two heat-generating elements, affixed to a surface of the substrate, the at least two heat-generating elements having upper surfaces that are not located entirely within the same plane;
a cooling module comprising a reservoir configured to receive a pressurized coolant fluid, a first wall, one or more side walls connected to the first wall to define a fluid plenum, the fluid plenum being partially surrounded and enclosed by the first wall and said one or more side walls, the fluid plenum further being open-ended on a side of the fluid plenum that is opposite from the first wall, the cooling module further comprising a plurality of impingement nozzles fluidly connecting the reservoir to the first wall of the fluid plenum;
a fastener, disposed between the substrate and said one or more side walls, that fixedly attaches said one or more side walls of the cooling module to the surface of the substrate so that the first wall, the one or more side walls and the open-ended side of the fluid plenum substantially surround and enclose the at least two heat-generating elements and a portion of the surface of the substrate to which the at least two heat-generating elements are affixed;

wherein, the plurality of impingement nozzles are configured to receive the pressurized coolant fluid from the reservoir, to elevate the velocity of the pressurized coolant fluid to convert the pressurized coolant fluid into a plurality of high-velocity microjets of pressurized coolant fluid and to direct the plurality of high-velocity microjets of pressurized coolant fluid to flow across the fluid plenum to directly impinge on the upper surfaces of said at least two heat-generating elements at high-velocity and in a direction that is perpendicular to the first wall of the fluid plenum; and wherein the reservoir, the plurality of impingement nozzles and the fluid plenum are configured to receive the pressurized coolant fluid in a liquid phase and cause the pressurized coolant fluid to pass through the plurality of impingement nozzles, flow across the fluid plenum and directly impinge on the upper surfaces of the heat-generating element without the pressurized coolant fluid undergoing a phase change, wherein the pressurized coolant fluid remains in the liquid phase after impinging on the upper surfaces of said at least two heat-generating elements.

2. The electronics assembly of claim 1, wherein the upper surfaces of the at least two heat generating elements are positioned at at least two different heights above the surface of the substrate.

3. The electronics assembly of claim 1, wherein the upper surfaces of the at least two heat-generating elements are bowed, or deflected, or convex, or concave, or slanted.

4. The electronics assembly of claim 1, wherein a first apex of a first upper surface of a first heat-generating element lies in a first horizontal plane that is closer to the surface of the substrate than a second horizontal plane of a second apex of a second upper surface of a second heat-generating element.

5. The electronics assembly of claim 1, wherein the upper surfaces of two of the at least two heat-generating elements affixed to the substrate have geometries that are different from each other.

6. The electronics assembly of claim 1, wherein the plurality of impingement nozzles are arranged to form an array of impingement nozzles disposed over at least one of the at least two heat-generating elements.

7. The electronics assembly of claim 6, wherein the plurality of impingement nozzles are arranged to form at least two arrays of impingement nozzles, comprising a first array of impingement nozzles disposed over a first heat-generating element and a second array of impingement nozzles disposed over a second heat-generating element.

8. The electronics assembly of claim 7, wherein impingement nozzles in the first array are different in size from impingement nozzles in the second array.

9. The electronics assembly of claim 7, wherein impingement nozzles in the first array are different in spacing from impingement nozzles in the second array.

10. The electronics assembly of claim 7, wherein impingement nozzles in the first array are different in number from impingement nozzles in the second array.

11. The electronics assembly of claim 7, wherein the first array is larger in size than the second array.

12. The electronics assembly of claim 7, wherein the first array has a different layout than the second array.

13. The electronics assembly of claim 7, wherein the density of impingement nozzles in the first array of impingement nozzles is greater than the density of impingement nozzles in the second array of impingement nozzles so that a first cooling performance delivered to the first heat-generating element will be greater than a second cooling performance delivered to the second heat-generating element.

14. The electronics assembly of claim 1, wherein the plurality of impingement nozzles in the first wall of the plenum are arranged non-uniformly in the first wall of the plenum to target local areas of high heat generation on one or more of the at least two heat-generating elements affixed to the substrate.

15. An electronics assembly, comprising:
a substrate;
a heat-generating element affixed to a surface of the substrate, the heat-generating element having an upper surface that varies in height relative to the surface of the substrate;
a cooling module comprising a reservoir configured to receive a pressurized coolant fluid, a first wall, one or more side walls connected to the first wall to define a fluid plenum, the fluid plenum being partially surrounded and enclosed by the first wall and said one or more side walls, the fluid plenum further being open-ended on a side of the fluid plenum that is opposite from the first wall, the cooling module further comprising a plurality of impingement nozzles fluidly connecting the reservoir to the first wall of the fluid plenum;
a fastener, disposed between the substrate and said one or more side walls, that fixedly attaches said one or more side walls of the cooling module to the surface of the substrate so that the first wall, the one or more side walls and the open-ended side of the fluid plenum substantially surround and enclose the heat-generating element and a portion of the surface of the substrate to which the heat-generating element is affixed;
wherein, the plurality of impingement nozzles are configured to receive the pressurized coolant fluid from the reservoir, to elevate the velocity of the pressurized coolant fluid to convert the pressurized coolant fluid into a plurality of high-velocity microjets of pressurized coolant fluid, and to direct the plurality of high-velocity microjets of pressurized coolant fluid to flow across the fluid plenum to directly impinge on the upper surface of the heat-generating element at high-velocity and in a direction that is perpendicular to the first wall of the fluid plenum; and wherein the reservoir, the plurality of impingement nozzles and the fluid plenum are configured to receive the pressurized coolant fluid in a liquid phase and cause the pressurized coolant fluid to pass through the plurality of impingement nozzles, flow across the fluid plenum and directly impinge on the upper surfaces of the heat-generating element without the pressurized coolant fluid undergoing a phase change, wherein the pressurized coolant fluid remains in the liquid phase after impinging on the upper surfaces of said at least two heat-generating elements.

16. The electronics assembly of claim 15, wherein, relative to the surface of the substrate, the upper surface of the heat-generating element is bowed, or deflected, or convex, or concave, or slanted.

17. The electronics assembly of claim 15, wherein one or more locations on the upper surface of the heat-generating element are not the same distance from the surface of the substrate as one or more other locations on the upper surface of the heat-generating element.

18. The electronics assembly of claim 15, wherein the upper surface of the heat-generating element affixed to the substrate has a non-planar shape.

19. The electronics assembly of claim 15, wherein the plurality of impingement nozzles are arranged to form an array of impingement nozzles disposed over the heat-generating element.

20. The electronics assembly of claim 19, wherein the plurality of impingement nozzles are arranged to form at least two arrays of impingement nozzles, comprising a first array of impingement nozzles disposed over a first portion of the heat-generating element and a second array of impingement nozzles disposed over a second portion of the heat-generating element.

21. The electronics assembly of claim 20, wherein impingement nozzles in the first array are different in size from impingement nozzles in the second array.

22. The electronics assembly of claim 20, wherein impingement nozzles in the first array are different in spacing from impingement nozzles in the second array.

23. The electronics assembly of claim 20, wherein impingement nozzles in the first array are different in number from impingement nozzles in the second array.

24. The electronics assembly of claim 20, wherein the first array is larger in size than the second array.

25. The electronics assembly of claim 20, wherein the first array has a different layout than the second array.

26. The electronics assembly of claim 20, wherein the density of impingement nozzles in the first array of impingement nozzles is greater than the density of impingement nozzles in the second array of impingement nozzles so that a first cooling performance delivered to the first portion of the heat-generating element will be greater than a second cooling performance delivered to the second portion of the heat-generating element.

27. The electronics assembly of claim 15, wherein the plurality of impingement nozzles in the first wall of the plenum are arranged non-uniformly in the first wall of the plenum to target local areas of high heat generation on the heat-generating element affixed to the substrate.

* * * * *